| United States Patent [19] | [11] Patent Number: 4,579,806 |
| Schupp et al. | [45] Date of Patent: Apr. 1, 1986 |

[54] POSITIVE-WORKING PHOTOSENSITIVE RECORDING MATERIALS

[75] Inventors: Hans Schupp, Wachenheim; Albert Elzer, Otterstadt; Klaus-Peter Jaeckel, Oberkirch; Reinhold J. Leyrer, Ludwigshafen, all of Fed. Rep. of Germany

[73] Assignee: BASF Aktiengesellschaft, Fed. Rep. of Germany

[21] Appl. No.: 645,768

[22] Filed: Aug. 30, 1984

[30] Foreign Application Priority Data

Sep. 2, 1983 [DE] Fed. Rep. of Germany ....... 3331691

[51] Int. Cl.$^4$ .................... G03C 1/495; G03C 5/16
[52] U.S. Cl. .................... 430/280; 430/270; 430/326
[58] Field of Search .............. 430/270, 280, 330, 326; 209/159.14

[56] References Cited

U.S. PATENT DOCUMENTS

| 3,849,137 | 11/1974 | Barzynski et al. | 204/159.14 |
| 3,926,636 | 12/1975 | Barzynski et al. | 430/280 |
| 4,035,189 | 7/1977 | Hayashi et al. | 96/115 R |
| 4,456,679 | 6/1984 | Leyrer et al. | 430/270 X |

FOREIGN PATENT DOCUMENTS 1147195 6/1980 Canada .

Primary Examiner—John E. Kittle
Assistant Examiner—Cynthia Hamilton
Attorney, Agent, or Firm—Keil & Weinkauf

[57] ABSTRACT

A curable photosensitive mixture which is suitable as a positive-working recording material contains (a) one or more polymers which have a molecular weight of >500, contain not less than 5% by weight, based on the molecular weight of the polymer, of aromatic and/or heteroaromatic o-nitrocarbinol ester groups and also contain two or more further reactive functional groups which are available for reaction with a thermal crosslinking agent, (b) one or more compounds which effect crosslinking and are capable of reacting with the further reactive functional groups of the polymer (a) under the action of heat, at temperatures substantially above room temperature, and (c) a filler, with or without (d) other conventional additives and/or assistants. The photosensitive mixture is particularly useful as a positive-working recording material for optical information fixing, principally for the production of thermally stable relief images or resist images and, particularly advantageously, of soldering masks.

14 Claims, No Drawings

POSITIVE-WORKING PHOTOSENSITIVE RECORDING MATERIALS

The present invention relates to a curable photosensitive mixture, in particular a solid mixture, which is suitable as a positive-working recording material and which contains, as the photosensitive component, a polymer which carries aromatic and/or heteroaromatic o-nitrocarbinol ester groups. The invention furthermore relates to recording materials having a curable photosensitive layer based on this mixture applied onto a dimensionally stable base, and to the use of these recording materials for the production of heat-stable relief images, relief plates or resist images, in particular soldering masks.

No. DE-C-21 50 691 and No. DE-A-29 22 746 describe positive-working recording materials for the production of relief images or resist images, whose photosensitive layer is based on o-nitrocarbinol ester-containing polymers which, after exposure, can be washed out with an alkaline solvent. According to No. DE-C-21 50 691, these polymers which carry o-nitrocarbinol ester groups can additionally contain further functional groups, e.g. nitrile, amide, amino, hydroxyl, N-methylol or epoxide groups. It is true that these conventional coating materials, which are useful for the production of resist layers or lithographic printing plates, are insensitive to thermal load when they are in the unexposed state, so that they have a long shelf life and are simple to process, for example by lamination. However, the thermal stability of these coating materials after exposure and development is inadequate for many intended uses, since the strength of the resist layers produced decreases sharply above 50° C. Furthermore, these relief images and resist images possess only limited solvent-resistance, which requires improvement for many intended uses. Moreover, the resistance of these materials to tracking is not yet satisfactory, so that they are generally unsuitable for use as soldering masks, for example in the production of printed circuits.

Furthermore, No. DE-B-23 09 062 discloses that relief images or resist images can be produced from photosensitive layers which contain a compound possessing aromatic o-nitrocarbinol ester groups and additionally contain an epoxy resin prepolymer, by a method in which the photosensitive layer is exposed imagewise, the latent image produced by the exposure and present in the exposed layer is selectively cured by means of a heat treatment, and the unexposed, uncured areas of the layer are then removed using a solvent. According to No. DE-B-23 09 062, the compound possessing o-nitrocarbinol ester groups can be a polymer, and the photosensitive layer may additionally contain fillers. Selective thermal curing of the layer which has been exppsed imagewise is necessary in order to achieve adequate differentiation between the exposed and unexposed areas of the layer with regard to solubility, and hence to permit the development of the relief images or resist images. Accordingly, the process described in No. DE-B-23 09 062 is negative-working and furthermore requires organic solvents for developing the exposed and selectively cured layer. The relief images or resist images produced as described in No. DE-B-23 09 062 furthermore possess only low thermal stability, and their resistance to solvents is unsatisfactory for many intended uses. According to No. DE-B-23 09 062, it is not possible to produce soldering masks which can be used industrially.

In order to use the photosensitive mixtures and coating materials, as described in No. DE-C-21 50 691 and No. DE-B-23 09 062, in positive-working processes, in which it is also possible to employ aqueous developers, for producing relief images or resist images which possess good, improved thermal stability and high resistance to chemicals and solvents and can be used as soldering masks, prior patent application Nos. DE-A-32 31 144 and DE-A-32 31 147 describe a process in which the relief images or resist images obtained after the imagewise exposure are post-exposed uniformly to actinic light and then thermally cured. Hence, in order to obtain heat-resistant relief images or resist images, an additional step is entailed in this process. Furthermore, in this process the thermal curing is preferably carried out in several stages at increasing temperatures in order to prevent the relief structure from being adversely affected at high curing temperatures.

It is an object of the present invention to provide a curable photosensitive mixture which is suitable as a positive-working recording material, has good exposure properties and high resolving power in layers of any thickness and permits the production of relief images, relief plates or resist images, in particular soldering masks, which possess good thermal stability, high mechanical strength, high resistance to chemicals and solvents and good insulating properties, such as resistance to tracking and dielectric strength. The curable photosensitive mixtures and the recording materials produced from these should be capable of being processed by very simple methods and of being washed out with aqueous developers. Both before and, in particular, after exposure and development of the relief images, relief plates or resist images, the said mixtures and materials should exhibit very good adhesion to permanent bases and be capable of being converted to products which possess exact image reproduction faithful to the original and have excellent relief structures.

We have found that this object is achieved by a curable photosensitive mixture which, in addition to a polymer possessing aromatic and/or heteroaromatic o-nitrocarbinol ester groups and two or more further reactive functional groups, contains a compound which effects crosslinking and is capable of reacting with the further reactive functional groups of the polymer under the action of heat, and one or more fillers, with or without other conventional additives and/or assistants.

The present invention accordingly relates to a curable photosensitive mixture which is suitable as a positive-working recording material and contains (a) at least one polymer which has a molecular weight of $>500$, contains not less than 5% by weight, based on the molecular weight of the polymer, of aromatic and/or heteroaromatic o-nitrocarbinol ester groups and also contains two or more further reactive functional groups which are available for reaction with a thermal crosslinking agent, (b) at least one compound which effects crosslinking and is capable of reacting with the further reactive functional groups of the polymer (a) under the action of heat, at temperatures substantially above room temperature, and (c) one or more fillers, with or without (d) other conventional additives and/or assistants.

The present invention furthermore relates to positive-working recording materials having a curable photosensitive layer applied onto a dimensionally stable base, wherein the said layer consists of a mixture of the type described above. The present invention also relates to the use of these curable photosensitive mixtures or recording materials for the production of heat-stable relief images, relief plates or resist images, in particular for the production of soldering masks.

During exposure to actinic light, the o-nitro-carbinol ester groups undergo cleavage to form free carboxyl groups bonded in the polymer (a), thereby producing a substantial differentiation between the exposed and unexposed areas with regard to solubility, and enabling the exposed areas of the mixture to be removed with aqueous developers. When the temperature is increased, the further reactive functional groups present in the polymer (a) react with the compounds (b) which effect crosslinking and are present in the mixture, so that an insoluble heat-resistant product possessing mechanical strength and chemical resistance is formed. The filler present in the curable photosensitive mixture serves, inter alia, to produce crisp, exact image contours and relief structures with steep sidewalls. A particular advantage of the novel curable photosensitive mixtures is that layers produced from them on the one hand are photosensitive and on the other hand can be thermally crosslinked in a step which is independent of the photosensitivity, without the optical resolution suffering or the shelf life at room temperature being restricted. The good adhesion properties of the novel mixtures and of the layers produced from them, in particular in the exposed and cured state, on conventional bases and substrates, in particular metal surfaces or bases for printed circuits, are also noteworthy.

The novel mixtures contain, as the photosensitive compound, a polymer (a) which possesses a mean molecular weight (number average) of >500, in particular from 10,000 to 100,000, and contains not less than 5% by weight, based on the molecular weight of the polymer, of aromatic and/or heteroaromatic o-nitrocarbinol ester groups bonded in the molecule. These o-nitrocarbinol ester groups are, in particular, of the general formula (I)

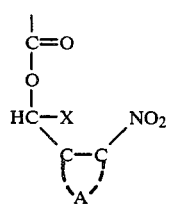

where A is a radical of an unsubstituted or subsituted aromatic or heteroaromatic 5-membered to 14-membered ring system and X is hydrogen, alkyl of 1 to 8 carbon atoms or an unsubstituted or substituted aryl or aralkyl radical. In addition to the o-nitrocarbinol ester groups, the polymer (a) also contains two or more further reactive functional groups which are available for the thermal crosslinking reaction with the compound (b) which effects crosslinking. Suitable components (a) are the conventional polymers, preferably those contaiing o-nitrocarbinol ester groups of the general formula (I) as described in, in particular, No. DE-C-21 50 691.

Examples of the aromatic or heteroaromatic ring system A which is present in the groups of the general formula (I) and can be mononuclear or polynuclear are naphthalene, anthracene, anthraquinone, phenanthrene and, in particular, unsubstituted or substituted benzene. Examples of suitable substituents for the aromatic ring system A, apart from the nitro group in the o-position, are alkyl of 1 to 8 carbon atoms, alkoxy of 1 to 6 carbon atoms, halogen, such as chlorine or bromine, nitro, amino, nitrile and sulpho. An example of a suitable heteroaromatic ring system is the pyridine radical. o-Nitrocarbinols from which the o-nitrocarbinol ester groups of the general formula (I) are preferably derived include, for example, o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and: 2-nitro-3-hydroxymethylpyridine.

The parent polymers on which the photosensitive polymers (a) are based are advantageously copolymers of olefinically unsaturated mono- or dicarboxylic acids, in particular of α,β-unsaturated mono- or dicarboxylic acids of 3 to 6 carbon atoms, e.g. acrylic acid, methacrylic acid, maleic acid, fumaric acid and/or crotonic acid. In the case of the photosensitive polymer (a) employed in the novel mixtures, Some or, preferably, all of the free carboxyl groups of these copolymers of unsaturated carboxylic acids are esterified with the stated aromatic and/or heteroaromatic o-nitrocarbinols. The said copolymers contain, as copolymerized monomers, compounds which contain reactive functional groups which, under the action of heat, are capable of reacting with the compound (b) which effects crosslinking. Particular examples of reactive functional groups of this type are hydroxyl, amine, amide, N-methylolamide, epoxide and/or blocked isocyanate groups. Examples of the corresponding comonomers which contain such reactive functional groups are N,N-dimethylaminoethyl acrylate and methacrylate, N-vinylimidazole, acrylamide, methacrylamide, monoesters of diols with unsaturated carboxylic acids, in particular with acrylic or methacrylic acid, e.g. β-hydroxyethyl acrylate or methacrylate, 2-hydroxypropyl acrylate or methacrylate, 3-hydroxypropyl acrylate or methacrylate or butanediol monoacrylate or monomethacrylate, methylol compounds of the amol type, e.g. N-methylolacrylamide, glycidyl esters of unsaturated carboxylic acids, in particular of acrylic or methacrylic acid, e.g. glycidyl acrylate or methacrylate, and glycidyl ethers of unsaturated alcohols, e.g. allyl glycidyl ether or 4-vinylcyclohexene dioxide.

The copolymers of the olefinically unsaturated carboxylic acids can furthermore contain other comonomers as copolymerized units, ethylene, styrene and the $C_1$-$C_8$-alkyl esters of the above ethylenically unsaturated carboxylic acids being particularly important as additional comonomers. Suitable polymers (a) can be prepared by, for example, copolymerization of aromatic and/or heteroaromatic o-nitrocarbinol esters of olefinically unsaturated carboxylic acids of the type under discussion, in particular of acrylic and/or methacrylic acid, with the olefinically unsaturated compounds possessing reactive functional groups, in particular appropriate acrylyl or methacrylyl compounds, with or without further comonomers, by a conventional method.

The amount of aromatic and/or heteroaromatic o-nitrocarbinol ester groups in the polymer (a) employed according to the invention is in general not less than 5% by weight, based on the molecular weight of the polymer (a), and can vary within wide limits, depending in particular on the properties desired for the photosensitive mixtures. During the exposure to actinic light, the o-nitrocarbinol ester groups undergo cleavage, and free carboxyl groups are formed in the polymer (a), with the result that its solubility is changed; hence, the o-carbinol ester groups in the polymer (a) are critical with regard to the differentiation in solubilities during the imagewise exposure of the novel photosensitive mixtures. The amount of these groups present is therefore chosen in general so that the novel photosensitive mixtures, after exposure to actinic light, are dispersible or soluble in aqueous solvents, e.g. water or aqueous alkaline solutions. Preferably, the content of aromatic and/or heteroaromatic o-nitrocarbinol ester groups of the type under discussion in the polymers (a) is from 10 to 30% by weight, based on the molecular weight of the polymer.

In order to achieve adequate crosslinking with component (b), the polymer (a) should contain not less than 2, but preferably more, of the further reactive functional groups which are available for the thermal crosslinking with component (b). The degree of crosslinking and of curing achievable in the novel curable photosensitive mixtures is essentially determined by, among other factors, the number of these further reactive functional groups in the polymer (a), so that this number likewise essentially depends on the properties desired for the end products, and can therefore likewise be varied within wide limits. It has proven advantageous if the polymers (a) contain, as copolymerized units, from 5 to 50, in particular from 10 to 30, % by weight of the copolymers possessing these reactive functional groups.

The novel curable photosensitive mixtures can contain one or more of the polymers (a), in general in amounts of from 20 to 85, preferably from 45 to 75, % by weight, based on the curable photosensitive mixture.

The said mixtures contain, in addition to the polymers (a), one or more compounds (b) which effect crosslinking and which, under the action of heat, are capable of reacting with the further reactive functional groups of the polymer (a). In order to ensure that the said mixtures have a long shelf life and can be readily processed, the said compounds (b) should be chosen so that they react with the further reactive functional groups of the polymer (a) at a noticeable rate only at elevated temperatures, i.e. substantially above room temperature. Advantageous compounds (b) are those in which the thermal crosslinking reaction with the reactive functional groups of the polymer (a) takes place at above 50° C., in particular above 80° C. Examples of compounds which effect crosslinking and are suitable components (b) are low molecular weight and/or high molecular weight compounds which contain two or more hydroxyl, amine, N-methylolamide, amide, epoxide and/or blocked isocyanate groups. Said compounds which are used as component (b) must of course be matched up with the reactive functional groups in the polymer (a) and should be chosen so that they can undergo a heat-induced crosslinking reaction with these groups in the mixture under conditions conforming to practice.

Preferred compounds (b) which effect crosslinking are the diepoxides or polyepoxides, which include the reaction products of epichlorohydrin with polyols, the reaction products of epichlorohydrin with polyamines, polyolefin-epoxides, epoxidized polybutadiene, epoxy resins of the novolak type, and high polymers of glycidyl esters of unsaturated carboxylic acids, in particular of acrylic or methacrylic acid. The epoxides based on epichlorohydrin and bisphenol A are particularly important. By substitution of the bisphenol A, it is possible to influence the properties of these epoxides in a conventional manner. Another group of suitable epoxides are those in which the terminal glycidyl groups are bonded through aliphatic or araliphatic radicals, the glycidyl ether of butane-1,4-diol being a typical example. Another important epoxide compound is bis-(epoxypropyl)aniline, which has an extremely low viscosity and can therefore be used as a bifunctional diluent. Among the high molecular weight epoxide compounds, the epoxy resins of the novolak type and the polyglycidyl acrylates and methacrylates are particularly important owing to their high functionality. For example, the stability to UV light can be increased by using cycloaliphatic epoxides whose molecule contains one or more cycloaliphatic rings but no aromatic rings. In the cycloaliphatic epoxides, the epoxide oxygen can be bonded exclusively to the cycloaliphatic rings, as in, for example, dicyclopentadiene dioxide, exclusively in the side chains, as in, for example, the diglycidyl ester of hexahydrophthalic acid, or both to the cyclic rings and to the side chains, as in, for example, vinylcyclohexene dioxide.

Other advantageous compounds (b) which effect crosslinking are blocked di- or polyisocyanates, the principal suitable protective components for blocking the isocyanates being phenols, acetonoxime, methyl ethyl ketoxime, ethyl acetoacetate or ethyl malonate. However, blocking can also be carried out using compounds such as acetylacetone, phthalimide, caprolactam, benzenesulfonamide or 2-mercaptobenzothiazole. Suitable di- or polyisocyanates are the conventional aliphatic, cycloaliphatic or aromatic compounds which possess two or more isocyanate groups per molecule, particularly preferably isophorone diisocyanate. A very suitable, highly effective blocked isocyanate compound is obtained from, for example, 1 mole of trimethylolpropane, 3 moles of 2,4-diisocyanatotoluene and 3 moles of phenol. Another example of a blocked isocyanate is the isocyanurate derivative obtained by trimerization of the reaction product of 2,4-diisocyanatotoluene and cresol. Other very suitable compounds which effect crosslinking are the blocked isocyanates prepared from toluylene diisocyanate, trimethylolpropane, butanediol and cresol. The group comprising the said compounds (b) also includes the known carbodiimides, as formed by the carbodiimidization of diisocyanates, e.g., $\alpha,\omega$-diisocyanatopolycarbodiimides from isophorone diisocyanate, which can likewise be regarded as blocked polyisocyanates.

Compounds (b) which effect crosslinking and have proven very useful also include polymers which contain hydroxyl, amino and/or N-methylol groups. Examples of these are phenol/formaldehyde resins, urea/formaldehyde resins and melamine/formaldehyde resins, the resins of the novolak type being preferred.

High molecular weight compounds (b) which effect crosslinking are preferably used in the curable photosensitive mixtures when the photosensitive polymer (a) has a relatively low molecular weight. If the photosensitive mixtures contain high molecular weight polymers (a) possessing o-nitrocarbinol ester groups, the said compounds (b) can be low molecular weight or high molecular weight, depending on the intended use and desired spectrum of properties of the photosensitive mixtures or of the recording materials produced from these.

Curable photosensitive mixtures which have proven very advantageous are those in which the said compound (b) is a di- or polyepoxide of the stated type, and the polymer (a) carrying o-nitrocarbinol ester groups contains, as further reactive functional groups, hydroxyl, amino and/or N-methylolamide groups. In another advantageous embodiment of the invention, the said mixtures contain, as compounds (b) which effect crosslinking, blocked di- or polyisocyanates and polymers (a) which carry o-nitrocarbinol ester groups and contain, as further reactive functional groups, hydroxyl, amino and/or N-methylolamide groups.

Curable photosensitive mixtures which contain phenol/formaldehyde resins, urea/formaldehyde resins and/or melamine/formaldehyde resins as crosslinking compounds (b) and in which the polymer (a) possessing o-nitrocarbinol ester groups contains amide or N-methylolamide groups have also proven useful.

The content of the said compounds (b) in the novel curable photosensitive mixtures essentially depends on the degree of crosslinking and of curing desired in the end product, and accordingly is related to the number of further reactive functional groups present in the o-nitrocarbinol ester-containing polymer (a). Like these, it can therefore be varied within wide limits. In general, the curable photosensitive mixture contains from 10 to 70, preferably from 20 to 50, % by weight, based on the polymer (a), of the compounds (b) which effect cross-linking.

The novel photosensitive mixtures contain, as a further essential component, one or more fillers (c), usually in amounts of from 0.5 to 8, preferably from 2 to 5, % by weight, based on the total curable photo-sensitive mixture. The fillers not only improve the mechanical properties, e.g. rigidity, etc., of the said mixtures or of the recording materials produced from them, but also, in particular, prevent the layers produced from the stated mixtures from exhibiting undesirable flow during thermal hardening, and are critical for the high resolution which can be achieved with these layers in the production of relief plates, resist images, soldering masks, etc. Furthermore, the fillers produce crisp, exact image contours and relief structures with steep sidewalls. Examples of suitable fillers are talc, calcium carbonate, silicon dioxides, e.g. ground quartz, amorphous silica or pyrogenic silica, silicates, such as aluminum silicates, silicate glasses, aluminum oxides, glass powder or glass dust, bentonites, etc. Of course, the fillers chosen should not have an adverse effect on the optical properties of the curable photosensitive mixtures, in particular their transparency in the wavelength range of the light which is actinic with regard to these mixtures. The mean particle size of these fillers is in general from 5 to 100 nm, preferably from 10 to 50 nm.

The novel curable photosensitive mixtures can furthermore contain other conventional additives and/or assistants. These can be compounds which facilitate the processing and handling of the said mixtures, e.g. plasticizers or leveling agents, or additives which improve or modify the performance characteristics of these mixtures or of the recording materials produced from them, e.g. sensitizers which increase the photosensitivity and the spectral sensitivity, dyes, pigments and/or photochromic substances, sensitometric regulators, catalysts for thermal curing and crosslinking reactions and, if required, further polymeric binders which are compatible with the o-nitrocarbinol ester-containing polymers (a), and the like. These assistants and/or additives can be employed in the conventional amounts.

Examples of plasticizing compounds, which are added particularly when the curable photosensitive mixtures are to be processed to layers from the molten mixture or are to be applied onto a base by lamination, and which should be compatible with the o-nitrocarbinol ester-containing polymers (a), are tricresyl phosphate, n-butylbenzyl phthalate and liquid polyesters obtained from aliphatic dicarboxylic acids and bifunctional glycols, in particular polyesters of adipic acid and propylene-1,2-glycol or butane-1,4-diol, having a viscosity of from 1,000 to 15,000 cP. If the said mixtures contain low molecular weight compounds as compounds (b) which effect crosslinking, these compounds can also act as plasticizers, and make the addition of separate plasticizing compounds partially or completely superfluous. The use of leveling agents, e.g. silicone oils, is particularly advisable when the curable photosensitive mixtures are to be processed further by casting from solution.

Examples of sensitizers which enable the photosensitivity and the spectral sensitivity of the said mixtures to be improved are xanthene dyes, e.g. fluoresceine, eosin and rodamine (S), and triplet energy carriers, as described by, for example, N.J. Turro in Molecular Photochemistry, W. A. Benjamin Inc., N.Y. 1967, page 132. Dyes which have proven particularly useful include Sudan, polymethine, azo, phthalocyanine and disperse dyes, and eosin, crystal violet and malachite green. Particularly advantageous dyes are those which undergo a reversible or irreversible color change when exposed to actinic light. For example, Sudan, polymethine and azo dyes are bleached out when exposed to actinic light in the presence of added photoinitiators, such as benzoin ethers, benzil ketals, benzophenone or Michler's ketone. Polymethine dyes of the general formula (II)

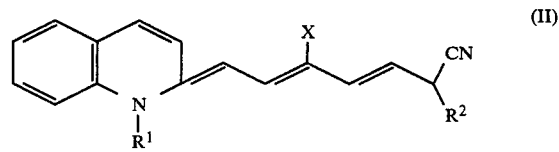

where $R^1$ is alkyl, $R^2$ is —CN, —COOR$^3$ or —Ph-R$^4$, $R^3$ is alkyl, $R^4$ is —NO$_2$, halogen, alkyl or alkoxy and X is halogen, have proven very useful.

Depending on the type of the said compounds (b) which are present in the novel photosensitive mixtures, and on the further reactive functional groups in the o-nitrocarbinol ester-containing polymers (a), it may be reasonable and useful for the said mixtures to contain catalysts for thermal curing and crosslinking between the component (b) and the further functional groups of the polymer (a). While, for example, the reaction between urea/formaldehyde or melamine/formaldehyde resins and amide groups, or, depending on the type of blocked isocyanate employed, the reaction between blocked isocyanates and hydroxyl or amine groups, takes place in general at as low as from 80° to 150° C., the addition reaction between epoxide groups and hydroxyl groups requires curing temperatures of 200° C. or higher. If, therefore, it is desired to carry out the reaction at lower curing temperatures in these cases too, it is advisable to add a suitable catalyst. The particular catalysts chosen are effective only at elevated temperatures, preferably at above 50° C., and in particular above 70° C., and permit the thermal curing and crosslinking reaction between the components (a) and (b) to take place as far as possible at no higher than 150° C., preferably no higher than 130° C. Examples of suitable catalysts are dicyanodiamide, melamine/formaldehyde resins and complexes of amines which undergo cleavage only at elevated temperatures, for example the complex of boron trifluoride with ethylamine. Cationic systems which can be activated thermally are also suitable, e.g. iodonium, phosphonium or sulfonium salts, as described in, for example, No. DE-A-31 39 520 and No. DE-A-28 54 011. The curable photosensitive mixture preferably contains the catalyst in an amount of from 1 to 5% by weight, based on the said mixture.

The said mixtures are in general solid, dry and nontacky. They can be prepared by mixing the individual components, for example in a kneader, mixer or the like, to give a homogeneous mixture, or by mixing solutions in suitable solvents, e.g. acetone, ethyl acetate, toluene or methylene chloride. They can particularly advantageously be used as positive-working recording materials for optical information fixing, for example for the production of printing and relief plates, relief images and resist images, in particular soldering masks. Positive-working recording materials are those which, after imagewise exposure to actinic light, contain exposed areas which become soluble in solvents in which they were previously insoluble.

The corresponding photosensitive recording materials can be produced by applying the novel curable photosensitive mixtures, in layers of the desired thickness, onto suitable bases. The choice of the base depends mainly on the intended use of the recording materials and of the relief images or resist images to be produced with them. Examples of suitable dimensionally stable bases are metallic, metal oxide or ceramic substrates, and films, sheets or panels made of polymeric substances. For example, copper sheets or copper-plated substrates can be used as bases for the production of resist images. In the production of thin-film circuits, the bases employed are, in particular, ceramic substrates coated with metallic or metal oxide layers, or semiconductor elements. Relief images and printing plates, in particular offset printing plates, can be produced using plastic films, e.g. polyester films, or metal bases, e.g. steel or aluminum sheets, as the base. Particularly for the production of offset printing plates, the plastic films may furthermore be coated with metal by vapor deposition, and the steel or aluminum sheets can be mechanically or electrochemically roughened and/or possess an anodically produced oxide layer. For the production of soldering masks, which is a particularly preferred use, layers of the curable photosensitive mixture can be applied onto, as the base, the circuit diagram of a printed circuit.

The layer of the curable photosensitive mixture can be applied onto the base by a conventional method, for example by applying a solution of the said mixture in a layer of suitable thickness onto the base by spincoating, gravure coating, dip coating, curtain coating or another similar method, evaporating the solvent and drying the photosensitive layer at a temperature at which thermal crosslinking and curing does not take place. However, the said mixture may also be converted into a photosensitive layer by, for example, pressing or calendering, and the resulting layer can be laminated onto the base with the use of pressure and, if necessary, heat; in this case too, the processing temperatures are chosen so that they are below the temperatures required for thermal crosslinking and curing of the said mixture. In a very advantageous embodiment, a photosensitive layer of the curable photosensitive mixture is first produced on a temporary base, in particular a plastic film, e.g. a polyethylene terephthalate film, for example by casting from solution. By means of such a photosensitive film resist material, the photosensitive layer of the novel mixture can then be laminated onto the permanent base with the use of pressure and, if required, heat. A particular advantage of this dry lamination method for the production of recording materials is that the photosensitive layer can be exposed uniformly to actinic light for a short time before being applied onto the permanent base. This pre-exposure is preferably carried out from that side of the photosensitive layer which is subsequently applied onto the permanent base. The pre-exposure leads not only to improved adhesion of the photosensitive layer to the permanent base, in particular a metallic or metal oxide substrate, but also to an increase in the photosensitivity of this layer during imagewise exposure and to a reduction in the development time after the imagewise exposure, without, for example, the faithful and exact reproduction of the transferred image in optical information fixing being in any way adversely affected as a result.

Depending on the intended use, the thickness of the photosensitive layers of the novel recording materials can be from 0.5 $\mu$m to a few millimeters, preferably not more than about 1 mm.

The novel recording materials are particularly useful for the production of thermally stable permanent printing and relief plates and, in particular, permanent protective and insulating layers which are structured imagewise, e.g. soldering masks, etc. For the production of relief images, relief plates or resist images, the photosensitive layer of the recording material is exposed to actinic light, preferably having a wavelength of from 220 to 600 nm, in particular from 300 to 420 nm, through an image-bearing transparency. Examples of suitable light sources are carbon arc lamps, high pressure mercury lamps, high pressure xenon lamps and, in particular, low pressure mercury fluorescence lamps. Imagewise exposure can also be carried out using an actinic laser beam modulated imagewise, e.g. a UV laser. The exposure times for the imagewise exposure are in general from 30 sec to a few minutes. After the imagewise exposure, the exposed areas of the layer are washed out with an aqueous developer in a conventional manner, for example by spraying, rubbing out or brushing out. The aqueous developer can be water as such or a mixture of water with a water-soluble organic solvent, for example a mixture of water with an aliphatic alcohol, acetone or tetrahydrofuran. In order to establish an advantageous pH, alkalis, e.g. borax, disodium hydrogen phosphate, sodium carbonate or alkali metal hydroxides, or organic bases, e.g. di- or triethanolamine, may be added to the developers. The washout solutions may furthermore contain added surfactants, e.g. sodium carboxymethylcellulose, polyvinyl alcohol, polysodium acrylate and the like.

In the production of soldering masks, the photosensitive layer of the novel mixture is applied onto that surface of a printed circuit board which is to be processed, for example onto the circuit diagram provided with circuit parts and holes, and the soldering eyes are laid bare by the imagewise exposure and development of the layer. In these cases, exposure of the photosensitive layer at the points where soldering eyes are to be laid bare can be carried out either through a photomask, or without the use of special photomask, in such a way that the perforated printed circuit board acts as the photomask. In this case, the photosensitive layer applied on the perforated printed circuit board is exposed through the holes in the said board, from the opposite side. Advantageously, a scattering foil or a mirror, for example a finely brushed aluminum sheet, is placed on the free surface of the curable photosensitive layer which faces away from the printed circuit board, this being done particularly where the light source used emits a high proportion of non-parallel light. This has the effect that the photosensitive resist layer in the region of the hole is more uniformly illuminated, so that the holes are exactly reproduced in the resist layer. In this embodiment of the process, only the areas of the holes are removed in the photosensitive layer, so that the soldering eyes, i.e. the conductive halos around the holes, remain protected. This is desirable on the component side of the printed circuit board, or even when the components are inserted by a solder-free method, for example by means of plug contacts. In the latter case, the embodiment which does not employ a film can be used on both sides of the printed circuit board.

After the exposed areas of the layer have been removed, that part of the photosensitive layer which remains on the base, i.e. the relief image or resist image which has been produced, is cured by the thermalcrosslinking reaction between the components (a) and (b). For this purpose, the layer is heated until the reaction between the said components takes place. In general, temperatures of from 70° to 200° C., preferably from 80° to 150° C., are required for this. The duration of thermal curing is in general from 20 to 120 min. Thermal curing can be carried out either by treating the layer with warm air, for example in an oven, or by heating the layer by means of infrared radiation. As a result of this subsequent thermal curing and crosslinking, the stability of the layer, in particular its chemical and mechanical resistance, is substantially improved; this heat treatment does not cause the relief structures to lose their crispness or, for example in the production of soldering masks, the layer to flow into the soldering eyes.

After the thermal curing and crosslinking, the relief images or resist images obtained possess very good resistance to chemicals and solvents, and high thermal stability, so that they can withstand, for example, temperatures as high as 260° C. for longer than 15 sec without being noticeably adversely affected. The relief structure is faithful to the original and possesses crisp edges, and the relief images and resist images possess excellent electrical properties with regard to volume resistivity, surface resistivity, dielectric strength and relative permittivity.

The Examples which follow illustrate the invention. Parts and percentages are by weight, unless stated otherwise.

EXAMPLE 1

50 parts of a copolymer of 20% of o-nitrobenzyl acrylate, 70% of methyl methacrylate and 10% of hydroxypropyl acrylate (prepared by free radical polymerization of the monomers with azodiisobutyronitrile in ethyl acetate; K value of the polymer: 28), 25 parts of a bisphenol A diglycidyl ether ($^R$Epikote 828 from Shell), 25 parts of n-butylbenzyl phthalate, 3 parts of boron trifluoride/ethylamine complex, 1 part of benzil dimethyl ketal, 0.1 part of the dye Sudan Deep Black BB, 0.2 part of the polymethine dye of the formula (II), where $R^1$ is methyl, $R^2$ is -COOEt and X is Cl, and 3 parts of a pyrogenic silica were dissolved in 150 parts by volume of ethyl acetate, the silica first being dispersed in ethyl acetate and then added as a dispersion.

A photosensitive layer of this solution was cast onto a polyester film so that, after removal of the solvent and drying, a 50 $\mu$m thick layer resulted. The photosensitive film resist material thus obtained was laminated, with the free surface of the photosensitive layer, onto a printed circuit at 120° C. and at a rate of 0.5 m/min. The polyester film was removed, and the photosensitive layer was then exposed imagewise through a photographic positive for 4 minutes in a flat-plate exposure unit (5000 W). The exposed, decolorized areas of the layer were washed out for 20 minutes with a mixture of 85% of water, 12% of 2-butoxyethanol and 3% of triethanolamine. The resulting resist image, which was faithful to the original and had crisp edges, was freed from residual developer by blowing out with compressed air, after which the resist image was cured for 2 hours in a through-circulation oven at 150° C. The resist obtained had very high thermal stability and excellent adhesion to the printed circuit used as the base, and even fine image elements were faithful to the original and had crisp contours. The resulting resist was very suitable as a soldering mask.

EXAMPLE 2

The procedure described in Example 1 was followed, except that the photosensitive layer, before being laminated onto the printed circuit, was pre-exposed uniformly from its free surface for 30 seconds, in the same flat-plate exposure unit as that used for the imagewise exposure. As a result, the exposure time for the imagewise exposure was reduced to 2 minutes. The product obtained had similar properties to the product of Example 1.

EXAMPLE 3

A photosensitive film resist material was produced and laminated onto a printed circuit, the steps being carried out as described in Example 1. After the polyester film had been removed, a finely brushed aluminum sheet was placed on the free surface of the photosensitive layer, and this layer was exposed to a 500 W very high pressure mercury lamp for 15 minutes from the opposite side, through the holes in the printed circuit. The photosensitive layer was then developed, dried and cured, these steps being carried out as described in Example 1. In the resulting soldering mask, the holes in the printed circuit were bared, whereas the soldering eyes remained protected.

EXAMPLE 4

A solution of 60 parts of a copolymer of 20% of o-nitrobenzyl acrylate, 69% of methyl methacrylate, 10% of hydroxypropyl acrylate and 1% of acrylic acid, 30 parts of n-butylbenzyl phthalate, 10 parts of an isophorone diisocyanate blocked with methyl ethyl ketoxime, 1 part of benzil dimethyl ketal, 0.1 part of Sudan Deep Black BB, 0.2 part of the polymethine dye of Example 1 and 3 parts of a pyrogenic silica in 150 parts by volume of ethyl acetate was cast to give a photosensitive layer which was processed further to give a soldering mask, these steps being carried out as described in Example 1. The exposure time for the imagewise exposure was 2 minutes in this case. The product obtained had properties similar to those of the product of Example 1.

EXAMPLE 5

50 parts of a copolymer of 20% of o-nitrobenzyl acrylate, 70% of methyl methacrylate and 10% of acrylamide, 15 parts of a melamine/formaldehyde resin, 35 parts of n-butylbenzyl phthalate, 3 parts of a pyrogenic silica, 1 part of benzil dimethyl ketal. 0.1 part of the dye Sudan Deep Black BB and 0.2 part of the polymethine dye of Example 1 were dissolved in 150 parts by volume of ethyl acetate to produce a curable photosensitive mixture. A photosensitive layer was cast from this solution onto a polyester film, and the layer was laminated onto a printed circuit, these steps being carried out as described in Example 1. The layer was exposed imagewise, developed and then cured for 1 hour at 130° C. The resulting product was very useful as a soldering mask.

EXAMPLE 6

A solution of 50 parts of a copolymer of 25% of o-nitrobenzyl acrylate, 70% of methyl methacrylate, and 5% of glycidyl methacrylate, 25 parts of the bisphenol A diglycidyl ether of Example 1, 28 parts of n-butylbenzyl phthalate, 3 parts of 1-cyanoguanidine, 3 parts of silica, 0.1 part of Sudan Deep Black BB, 0.2 part of the polymethine dye of Example 1 and 1 part of benzil dimethyl ketal in 150 parts by volume of ethyl acetate was prepared. A heat-cured resist image possessing high resolution and crisp contours was produced from this solution as described in Example 1. The exposure time for the imagewise exposure was 6 minutes in this case.

EXAMPLE 7

A photosensitive mixture was produced by dissolving the following components in 150 parts by volume of ethyl acetate: 80 parts of a copolymer of 25% of o-nitrobenzyl acrylate, 70% of methyl methacrylate and 5% of N-methylolamide, 10 parts of a melamine/formaldehyde resin, 30 parts of n-butylbenzyl phthalate, 1 part of benzil dimethyl ketal, 0.1 part of Sudan Deep Black BB, 0.2 part of the polymethine dye of Example 1 and 3 parts of pyrogenic silica. By means of the procedure described in Example 1, this solution was used to produce a soldering mask having very good performance characteristics.

We claim:

1. A curable photosensitive mixture which is suitable as a positive-working recording material and comprises
(a) one or more copolymers (a) having a molecular weight >500 and containing (1) at least 5% by weight, based on the weight of the copolymer (a), of a comonomer containing aromatic and/or heteroaromatic o-nitrocarbinol ester groups and (2) comonomer units containing functional groups which are available for crosslinking by thermal reaction;
(b) one or more compounds which effect crosslinking and are capable of reacting with the reactive functional groups of the comonomer units (2) of the copolymer (a) under the action of heat, at temperatures, above 50° C. and
(c) one or more fillers.

2. A photosensitive mixture as defined in claim 1, wherein the comonomer units of units (2) the copolymer (a), contain as reactive functional groups, hydroxyl, amine, amide, N-methylolamide, epoxide and/or blocked isocyanate groups.

3. A photosensitive mixture as defined in claim 1, wherein the compound (b) which effects crosslinking is a low molecular weight or high molecular weight compound containing two or more epoxide, blocked isocyanate, amide, N-methylolamide, hydroxyl and/or amine groups.

4. A photosensitive mixture as defined in claim 1, wherein the comonomer units (2) of the copolymer (a), contain as functional groups, hydroxyl, amine or N-methylolamide groups, and the compound (b) which effects crosslinking is a a di- or polyepoxide.

5. A photosensitive mixture as defined in claim 1, wherein the comonomer units (2) of the copolymer (a), contain as further functional groups, hydroxyl, amine or N-methylolamide groups, and the compound (b) which effects crosslinking is a blocked di- or polyisocyanate.

6. A photosensitive mixture as defined in claim 1, wherein the comonomer units (2) of the copolymer (a), contain as further reactive functional groups, amide or N-methylolamide groups, and the compound (b) which effects crosslinking is a melamine/formaldehyde resin, a urea/formaldehyde resin or a phenol/formaldehyde resin.

7. A photosensitive mixture as defined in claim 1, containing further additives and/or assistants as additional component (d).

8. A photosensitive mixture as defined in claim 7, containing, as compound (d), a heat-activated catalyst for the thermal curing and crosslinking of the components (a) and (b).

9. A photosensitive mixture as defined in claim 1, wherein the polymer (a) is a copolymer of an olefinically unsaturated carboxylic acid, esterified with aromatic and/or heteroaromatic o-nitrocarbinols, and olefinically unsaturated monomers containing further reactive functional groups, with or without other comonomers.

10. A photosensitive mixture as defined in claim 9, wherein the copolymer (a) is a copolymer of acrylic or methacrylic acid, esterified with aromatic and/or heteroaromatic o-nitrocarbinols, and acrylyl or methacrylyl compounds possessing the functional groups available for thermal crosslinking, with or without other comonomers.

11. A positive-working recording material for the production of thermally stable relief images, relief plates or resist images, having a curable photosensitive layer applied onto a dimensionally stable base, wherein the said layer comprises a mixture as claimed in claim 1.

12. A photosensitive mixture as defined in claim 1, wherein the copolymer (a) contains from 10 to 30% by weight of the comonomer containing aromatic and/or heteroaromatic o-nitrocarbinol ester groups.

13. A photosensitive mixture as defined in claim 12, wherein the copolymer (a) contains from 5 to 50% by weight of comonomer units containing functional groups which are available for crosslinking by thermal reaction plus from 20 to 85% by weight of further comonomers.

14. A photosensitive mixture as defined in claim 1, wherein the copolymer (a) has a molecular weight of from 10,000 to 100,000.

* * * * *